United States Patent
Shigematsu et al.

(10) Patent No.: US 11,811,381 B2
(45) Date of Patent: Nov. 7, 2023

(54) FILTER ELEMENT

(71) Applicant: Murata Manufacturing Co., Ltd., Nagaokakyo (JP)

(72) Inventors: Satoshi Shigematsu, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 238 days.

(21) Appl. No.: 17/356,571

(22) Filed: Jun. 24, 2021

(65) Prior Publication Data

US 2021/0320638 A1    Oct. 14, 2021

Related U.S. Application Data

(63) Continuation of application No. PCT/JP2020/031308, filed on Aug. 19, 2020.

(30) Foreign Application Priority Data

Sep. 6, 2019   (JP) .................................. 2019-162553

(51) Int. Cl.
    *H03H 7/01*       (2006.01)
    *H03H 7/09*       (2006.01)
    (Continued)

(52) U.S. Cl.
    CPC ....... *H03H 7/0115* (2013.01); *H01F 27/2804* (2013.01); *H01F 27/29* (2013.01);
    (Continued)

(58) Field of Classification Search
    CPC . H03H 7/09; H03H 2001/0085; H03H 7/0115
    (Continued)

(56) References Cited

U.S. PATENT DOCUMENTS 5,602,517 A  *  2/1997  Kaneko ............... H01F 17/0013
                                                  336/200
11,005,442 B2 *  5/2021  Wang ...................... H03H 7/09
(Continued)

FOREIGN PATENT DOCUMENTS

JP    10-13180 A       1/1998
JP    2001-156569 A    6/2001
(Continued)

OTHER PUBLICATIONS

Official Communication issued in corresponding Japanese Patent Application No. 2021-518821, dated May 25, 2021.
(Continued)

*Primary Examiner* — Rakesh B Patel
(74) *Attorney, Agent, or Firm* — KEATING & BENNETT, LLP

(57) ABSTRACT

First and second coils have winding axes in a laminated direction of base material layers and are magnetically coupled to each other. First and second capacitors are positioned in the laminated direction on layers different from layers on which the first and second coils are provided. The first and second coils are connected so that the winding directions of the first and second coils are opposite. The second capacitor is connected in parallel to a series circuit of the first coil and the second coil. The first capacitor is connected between a position where the first coil is connected to the second coil and a reference potential electrode. Mutual inductance caused by coupling between the first and second coils and the first capacitor provides a first attenuation pole and a parallel connection circuit of the series circuit and the second capacitor provides a second attenuation pole.

10 Claims, 8 Drawing Sheets

(51) Int. Cl.
  *H01F 27/28* (2006.01)
  *H01F 27/29* (2006.01)
  *H01F 27/40* (2006.01)
  *H01G 4/012* (2006.01)
  *H01G 4/30* (2006.01)

(52) U.S. Cl.
  CPC ............ *H01F 27/40* (2013.01); *H01G 4/012* (2013.01); *H01G 4/30* (2013.01); *H03H 7/09* (2013.01); *H01F 2027/2809* (2013.01)

(58) Field of Classification Search
  USPC .................................................. 333/175, 185
  See application file for complete search history.

(56) References Cited

U.S. PATENT DOCUMENTS

| | | |
|---|---|---|
| 2002/0158712 A1 | 10/2002 | Yamaguchi |
| 2007/0025043 A1 | 2/2007 | Terada et al. |
| 2013/0328642 A1 | 12/2013 | Ma et al. |

FOREIGN PATENT DOCUMENTS

| | | |
|---|---|---|
| JP | 2002-217668 A | 8/2002 |
| JP | 2007-043216 A | 2/2007 |
| JP | 2011-004324 A | 1/2011 |

OTHER PUBLICATIONS

Official Communication issued in International Patent Application No. PCT/JP2020/031308 dated Nov. 2, 2020.

\* cited by examiner

<WITHOUT C2>

⟨C2:0.1pF⟩

⟨C2:0.2pF⟩

⟨C2:0.3pF⟩

FILTER ELEMENT

CROSS REFERENCE TO RELATED APPLICATIONS

This application claims the benefit of priority to Japanese Patent Application No. 2019-162553 filed on Sep. 6, 2019 and is a Continuation Application of PCT Application No. PCT/JP2020/031308 filed on Aug. 19, 2020. The entire contents of each application are hereby incorporated herein by reference.

BACKGROUND OF THE INVENTION

1. Field of the Invention

The present invention relates to a filter element including coils and capacitors in a multilayer body including base material layers.

2. Description of the Related Art

Coil conductors and capacitor electrodes are provided in multilayer bodies including base material layers of LC filter elements in the related art.

For example, Japanese Unexamined Patent Application Publication No. 10-13180 discloses a filter element including an inductor and a capacitor in a multilayer body in which base material layers are laminated.

In the filter element described in Japanese Unexamined Patent Application Publication No. 10-13180, coils (transformer) and a capacitor are arranged in a laminated direction, a primary coil of the transformer is inversely coupled to a secondary coil thereof, one end of the capacitor is connected to a node between the primary coil and the secondary coil, and the other end of the capacitor is grounded. With this configuration, the filter element entirely defines and functions as a low pass filter. In addition, mutual inductance M occurring on a path from the node between the primary coil and the secondary coil to a shunt and the capacitor define an attenuation pole.

However, in the filter element in the related art, the attenuation pole provided by the mutual inductance M and the capacitor may not have large attenuation and the attenuation of the attenuation pole may be insufficient. In addition, the attenuation band width may be insufficient.

SUMMARY OF THE INVENTION

Preferred embodiments of the present invention provide filter elements in each of which the attenuation of an attenuation band is ensured or in each of which the bandwidth of the attenuation band is ensured.

A filter element according to a preferred embodiment of the present invention includes a multilayer body including laminated base material layers, internal elements provided in the multilayer body, a first terminal electrode, a second terminal electrode, and a reference potential electrode. The first terminal electrode, the second terminal electrode, and the reference potential electrode are provided on an outer surface of the multilayer body. The internal elements include a first coil, a second coil, a first capacitor, and a second capacitor. The first coil and the second coil have winding axes in a laminated direction of the base material layers and a coil opening of the first coil is overlapped with that of the second coil for magnetic coupling. The first capacitor and the second capacitor are provided in the laminated direction on layers different from layers of the multilayer body on which the first coil and the second coil are provided. The first coil is differentially connected to the second coil. The second capacitor is connected in parallel to a series circuit of the first coil and the second coil. The first capacitor is connected between a position where the first coil is connected to the second coil and the reference potential electrode.

According to preferred embodiments of the present invention, since not only the first attenuation pole is provided by the mutual inductance caused by the coupling between the first coil and the second coil and the first capacitor but also the second attenuation pole is provided by the parallel connection circuit of the series circuit of the first coil and the second coil and the second capacitor, it is possible to provide filter elements each having a large attenuation or each having an attenuation characteristic of a wide attenuation band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described in detail below with reference to the drawings.

First Preferred Embodiment

Figure 1:
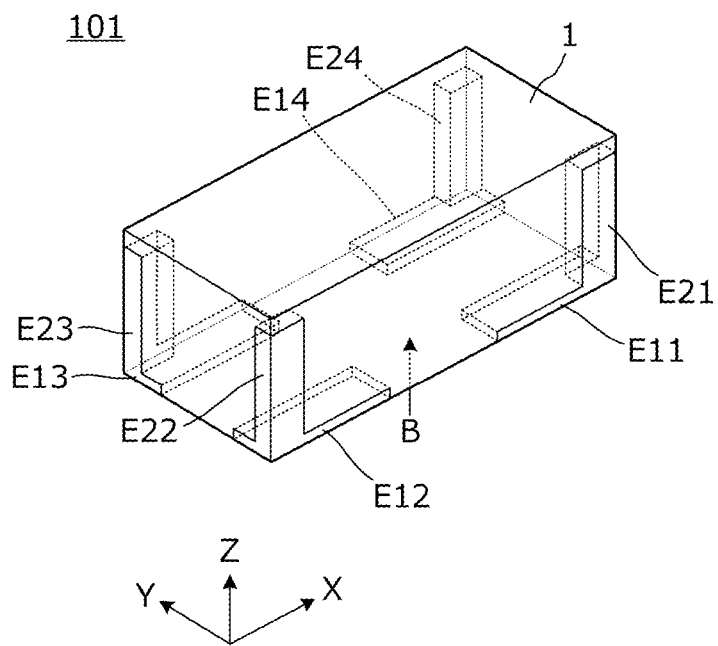
FIG. 1 is a perspective view of a filter element 101 according to a first preferred embodiment of the present invention.

FIG. 1 is a perspective view of a filter element 101 according to a first preferred embodiment of the present invention. The filter element 101 includes a rectangular or substantially rectangular parallelepiped multilayer body 1 including laminated base material layers, internal elements provided in the multilayer body 1, a first terminal electrode E11, a second terminal electrode E12, a third terminal electrode E13, and a fourth terminal electrode E14. The first terminal electrode E11, the second terminal electrode E12, the third terminal electrode E13, and the fourth terminal electrode E14 are provided on an outer surface of the multilayer body 1. The third terminal electrode E13 corresponds to a "reference potential electrode". The internal elements include coils and capacitors connected between the first terminal electrode E11 and the second terminal electrode E12. The filter element 101 is mounted on a circuit board or the like with a mounting surface B. Coordinate axes are represented in FIG. 1, in which axes parallel or substantially parallel to the respective sides of the multilayer body 1 are set to the X axis, the Y axis, and the Z axis.

Figure 2:
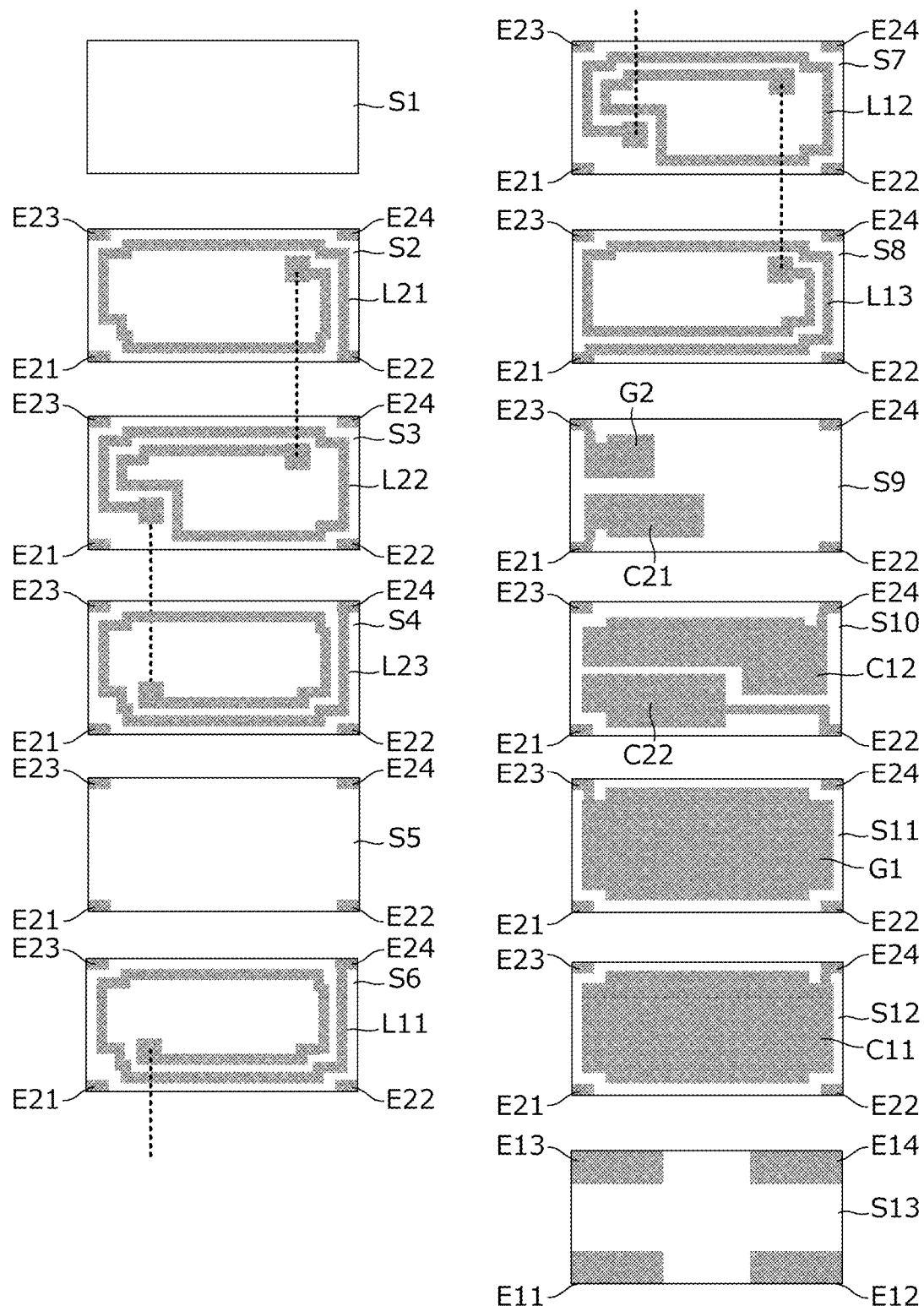
FIG. 2 is an exploded plan view of insulating base material patterns and conductive patterns provided on the respective base material layers of the filter element 101.
Figure 3:
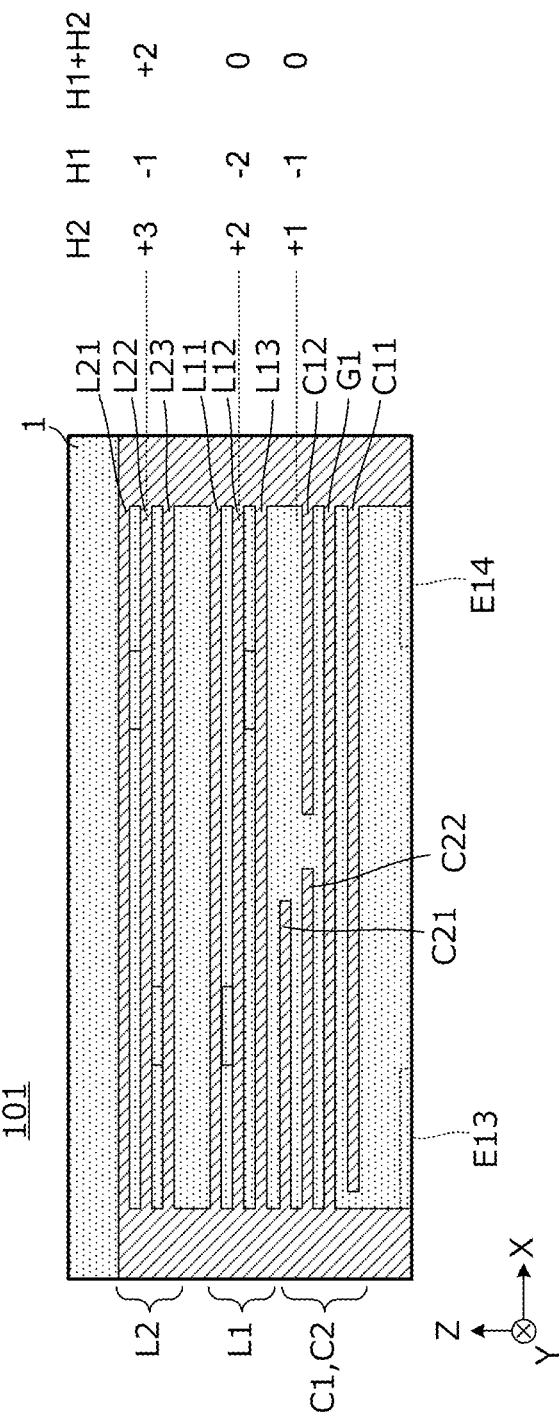
FIG. 3 is a cross-sectional view along a certain surface parallel or substantially parallel to the X-Z face of the filter element 101.

FIG. 2 is an exploded plan view of insulating base material patterns and conductive patterns provided on the respective base material layers of the filter element 101. FIG. 3 is a cross-sectional view along a certain surface parallel or substantially parallel to the X-Z surface of the filter element 101.

A base material layer S1 is a top base material layer and a base material layer S13 is a bottom base material layer. Base material layers S2 to S12 are base material layers between the top base material layer S1 and the bottom base material layer S13. The first terminal electrode E11, the second terminal electrode E12, the third terminal electrode E13, and the fourth terminal electrode E14 are provided on the base material layer S13. Side-portion terminal electrodes E21, E22, E23, and E24 are provided on the base material layers S2 to S12. The terminal electrodes having the same reference numeral and letters, among the side-portion terminal electrodes E21, E22, E23, and E24 provided on the respective base material layers, are connected to each other. The side-portion terminal electrode E21 is connected to the first terminal electrode E11 provided on the base material layer S13, the side-portion terminal electrode E22 is connected to the second terminal electrode E12 provided on the base material layer S13, the side-portion terminal electrode E23 is connected to the third terminal electrode E13 provided on the base material layer S13, and the side-portion terminal electrode E24 is connected to the fourth terminal electrode E14 provided on the base material layer S13.

First coil conductors L11, L12, and L13 are provided on the base material layers S6, S7, and S8, respectively. Second coil conductors L21, L22, and L23 are provided on the base material layers S2, S3, and S4, respectively. Broken lines indicate the connection relationship with via conductors in FIG. 2.

A first end of the second coil conductor L21 is connected to the side-portion terminal electrode E22. A via conductor with which a second end of the second coil conductor L21 is connected to a first end of the second coil conductor L22 is provided in the base material layer S2. A via conductor with which a second end of the second coil conductor L22 is connected to a first end of the second coil conductor L23 is provided in the base material layer S3. A second end of the second coil conductor L23 is connected to the side-portion terminal electrode E24. The second coil conductors L21, L22, and L23 and the via conductors define a second coil L2.

A first end of the first coil conductor L11 is connected to the side-portion terminal electrode E24. A via conductor with which a second end of the first coil conductor L11 is connected to a first end of the first coil conductor L12 is provided in the base material layer S6. A via conductor with which a second end of the first coil conductor L12 is connected a first end of the first coil conductor L13 is provided in the base material layer S7. A second end of the first coil conductor L13 is connected to the side-portion terminal electrode E21. The first coil conductors L11, L12, and L13 and the via conductors define a first coil L1.

When the multilayer body 1 is viewed from a direction parallel or substantially parallel to the Z axis, coil openings of the first coil conductors L11, L12, and L13 are overlapped with coil openings of the second coil conductors L21, L22, and L23 (winding axes of the first coil conductors L11, L12, and L13 coincide with winding axes of the second coil conductors L21, L22, and L23). Accordingly, the first coil L1 is magnetically coupled to the second coil L2.

Capacitor electrodes C21 and C22 are provided on the base material layers S9 and S10, respectively. The capacitor electrodes C21 and C22 define a second capacitor C2.

A ground electrode G2 is provided on the base material layer S9, a capacitor electrode C12 is provided on the base material layer S10, a ground electrode G1 is provided on the base material layer S11, and a capacitor electrode C11 is provided on the base material layer S12. The ground electrodes G1 and G2 and the capacitor electrodes C11 and C12 define a first capacitor C1.

The second coil L2 is at a position spaced farther from the first capacitor C1 and the second capacitor C2 in a laminated direction (the Z-axis direction), compared with the first coil L1. The inductance of the second coil L2 is higher than the inductance of the first coil L1. In this example, although the number of turns of the first coil L1 is slightly larger than the number of turns of the second coil L2, the second coil conductors L21, L22, and L23 are spaced farther from the respective capacitor electrodes, compared with the first coil conductors L11, L12, and L13. Accordingly, the inductance of the second coil L2 is higher than the inductance of the first coil L1, as described above.

As illustrated in FIG. 3, the strength-of-magnetic-field caused by the first coil L1 is denoted by H1 and the strength-of-magnetic-field caused by the second coil L2 is denoted by H2. The strength of the magnetic field of a central portion at the center height of the second coil L2, which is caused by the second coil L2, is indicated by +3, the strength of the magnetic field of a central portion at the center height of the first coil L1, which is caused by the first coil L1, is indicated by −2, and the strength of the magnetic field near the heights of the capacitor electrodes C21, C22, and C12 is indicated by +1. These strengths of the magnetic field are schematically represented. As illustrated in FIG. 3, the combined strength of the strength-of-magnetic-field H1 and the strength-of-magnetic-field H2 is +2 in the central portion at the center height of the second coil L2, is 0 in the central portion at the center height of the first coil L1, and is 0 near the capacitor electrodes C21, C22, and C12.

As described above, the orientation of the magnetic flux caused by the first coil L1 is opposite to the orientation of the magnetic flux caused by the second coil L2 and, when the magnetic field caused by the second coil L2, which is spaced farther from the capacitor electrodes, is stronger than that caused by the first coil L1, which is closer to the capacitor electrodes, the magnetic field near the capacitor electrodes C21, C22, and C12 is reduced or prevented. As a result, an eddy current occurring at the capacitor electrodes C21, C22, and C12 and so on is reduced or prevented and a reduction in the inductance of the first coil L1 and the second coil L2 is reduced or prevented.

In the present preferred embodiment, the capacitance of the first capacitor C1 is higher than the capacitance of the second capacitor C2. In other words, the area of the ground electrodes G1 and G2 and the capacitor electrodes C11 and C12 is greater than the area of the capacitor electrodes C21 and C22. The first capacitor C1 is at a position spaced farther from the first coil L1 and the second coil L2, compared with the second capacitor C2. Accordingly, planar conductors including the capacitor electrodes and the ground electrodes, which interrupt the magnetic flux caused by the first coil L1 and the second coil L2, have small effective areas and the eddy current described above is effectively reduced or prevented.

The respective base material layers S1 to S13 of the multilayer body 1 are formed by, for example, screen printing using photosensitive insulating paste and photosensitive conductive paste, exposure, and development. Laminating these base material layers forms the multilayer body 1.

Specifically, for example, the photosensitive insulating paste layer is subjected to the screen printing, is irradiated with ultraviolet, and is developed using alkali solution. This forms the insulating base material patterns including the openings for outer electrodes, via holes, and so on. In addition, for example, the photosensitive conductive paste is subjected to the screen printing, is irradiated with ultraviolet, and is developed using alkali solution to form the conductive patterns. The insulating base material patterns and the conductive patterns are laminated to form a mother multilayer body. Then, the mother multilayer body are cut into pieces to form many multilayer bodies 1. For example, Ni/Au solder is applied to the surfaces of the respective outer electrodes in order to improve solderability, improve conductivity, and improve environmental resistance.

The method of forming the multilayer body 1 is not limited to the above one. For example, a method may be used in which conductor paste is applied to screen masks having the openings formed in the shapes of the conductive patterns and the screen masks are laminated. Alternatively, conductive foils may be applied to the insulating base materials to form the conductive patterns on the respective base material layers through patterning of the conductive foils. The method of forming the outer electrodes is not limited to the above one. For example, the outer electrodes may be formed on the bottom surface and side surfaces of the multilayer body 1 by dipping of the laminated body into the conductor paste or sputtering of the conductor paste on the laminated body. In addition, the surfaces of the outer electrodes may be subjected to plating.

Figure 4A:
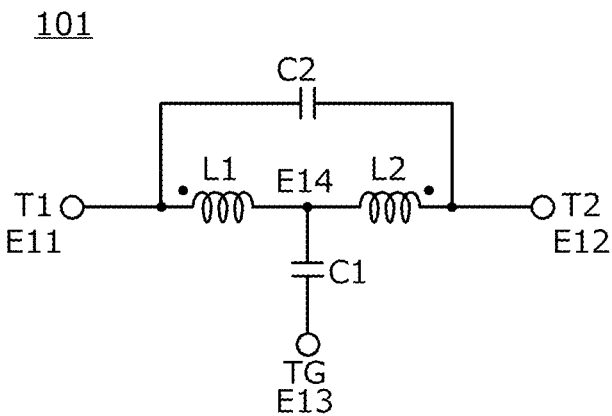
FIG. 4A is a circuit diagram of the filter element 101 and FIG. 4B is an equivalent circuit diagram of the filter element 101.
Figure 4B:
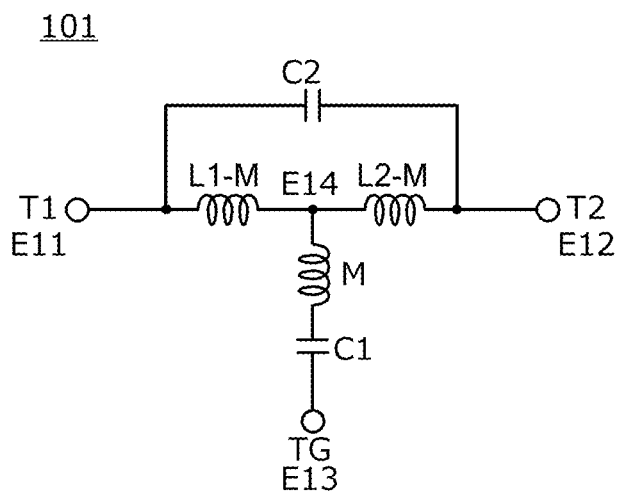

FIG. 4A is a circuit diagram of the filter element 101. FIG. 4B is an equivalent circuit diagram of the filter element 101. Referring to FIG. 4A, the first coil L1 and the second coil L2, which are connected in series to each other, and the first capacitor C1, which is shunt-connected to the first coil L1 and the second coil L2, define a T-shaped filter. In addition, the second capacitor C2 is connected in parallel to the series circuit of the first coil L1 and the second coil L2 to define a "parallel connection circuit".

The first coil L1 includes the first coil conductors L11, L12, and L13 illustrated in FIG. 2 and the second coil L2 includes the second coil conductors L21, L22, and L23 illustrated in FIG. 2. The first capacitor C1 includes the ground electrodes G1 and G2 and the capacitor electrodes C11 and C12 and the second capacitor C2 includes the capacitor electrodes C21 and C22.

In FIGS. 4A and 4B, a first terminal T1 corresponds to the first terminal electrode E11 and a second terminal T2 corresponds to the second terminal electrode E12. A reference potential terminal TG corresponds to the third terminal electrode E13. This circuit defines and functions as a filter circuit in which the reference potential terminal TG is connected to reference potential (ground potential) to input and output an unbalanced signal into and from the first terminal T1 and the second terminal T2. A circuit having an impedance of, for example, about 50Ω is connected to each of the first terminal T1 and the second terminal T2.

The first coil L1 and the second coil L2 illustrated in FIG. 4A have the winding axes in the laminated direction of the base material layers. The coil opening of the first coil L1 is overlapped with that of the second coil L2 to provide magnetic coupling. The first coil L1 is connected in series to the second coil L2 so that the winding direction of the first coil L1 is opposite to the winding direction of the second coil L2. In other words, the first coil L1 is differentially connected to the second coil L2. Here, the inductances of the two series-connected elements are represented by (L1−M) and (L2−M) and the inductance of the shunt-connected element is represented by M, as illustrated in FIG. 4B, where the inductance of the first coil L1 is denoted by L1, the inductance of the second coil L2 is denoted by L2, and the mutual inductance caused by coupling between the first coil L1 and the second coil L2 is denoted by M. An LC series circuit composed of the mutual inductance M and the first capacitor C1, which are shunt-connected to each other, forms a first attenuation pole.

In FIG. 4B, the inductance of the series circuit of the first coil L1 and the second coil L2, which are magnetically coupled to each other, is (L1−M)+(L2−M)=L1+L2−2M. This series circuit and the second capacitor C2 define an LC parallel circuit and the LC parallel circuit provides a second attenuation pole.

Figure 5:
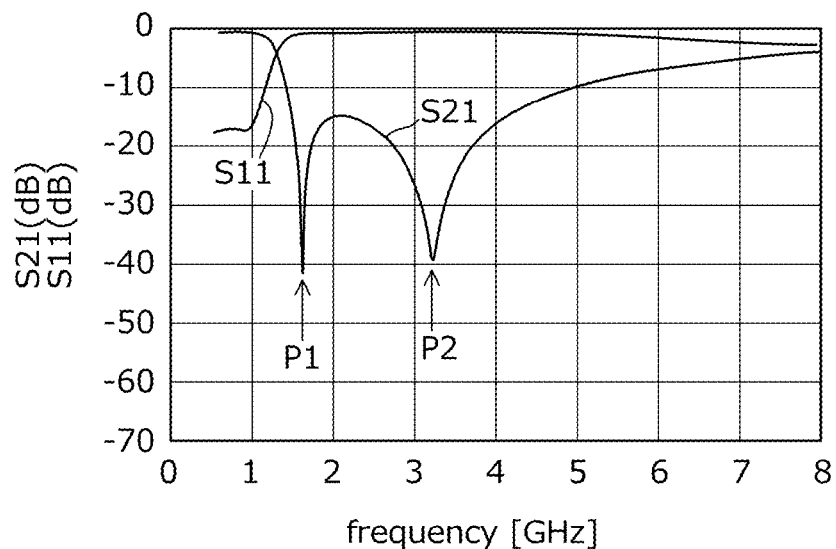
FIG. 5 is a graph of frequency characteristics of the filter element 101.

FIG. 5 is a graph of frequency characteristics of the filter element 101 of the present preferred embodiment. FIG. 5 is a graph of the frequency characteristics of a reflection coefficient S11 and a permeability coefficient S21. The respective elements illustrated in FIG. 4A have the following values:

L1: about 9.3 nH
L2: about 11.6 nH
C1: about 1.6 pF
C2: about 0.2 pF
k: about 0.6 (coupling coefficient of the first coil L1 and the second coil L2)

Referring to FIG. 5, an attenuation pole P1 is the first attenuation pole provided by the LC series circuit including the mutual inductance M and the first capacitor C1, and an attenuation pole P2 is the second attenuation pole provided by the parallel connection circuit including the series circuit of the first coil L1 and the second coil L2 and the second capacitor C2.

In the example illustrated in FIG. 5, the insertion loss at about 900 MHz is about 0.408 dB and the cutoff frequency is about 1.3 GHz. An attenuation characteristic not higher than about −10 dB is achieved over a wide band from about 1.5 GHz to about 5 GHz.

According to the present preferred embodiment, since not only the first attenuation pole P1 is provided by the mutual inductance caused by the coupling between the first coil L1 and the second coil L2 and the first capacitor C1, but also the second attenuation pole P2 is provided by the parallel connection circuit composed of the series circuit of the first coil L1 and the second coil L2 and the second capacitor C2 at the high frequency side of the first attenuation pole P1, the filter element having the attenuation characteristic of a wide attenuation band is achieved. In addition, since the first attenuation pole P1 is steep, it is possible to steepen the boundary between the passband and the cutoff band. In contrast, since the second attenuation pole P2 provided by the parallel connection circuit is relatively gentle, it is possible to attenuate the attenuation band over a wide band.

Second Preferred Embodiment

In a second preferred embodiment of the present invention, an example of a filter element including a third capacitor is described.

Figure 6:
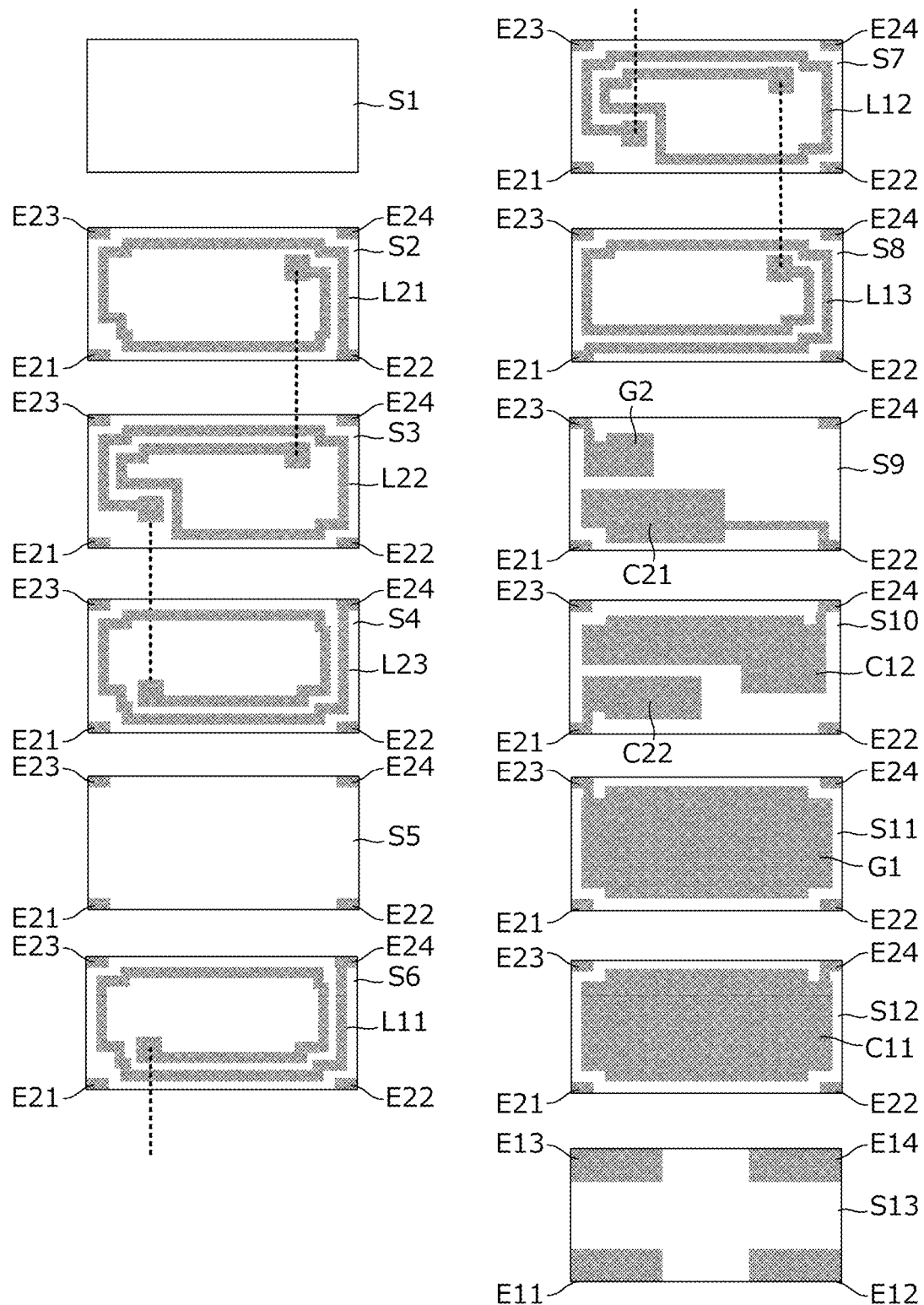
FIG. 6 is an exploded plan view of the insulating base material patterns and the conductive patterns provided on the respective base material layers of a filter element according to a second preferred embodiment of the present invention.

FIG. 6 is an exploded plan view of the insulating base material patterns and the conductive patterns provided on the respective base material layers of the filter element according to the second preferred embodiment. The example illustrated in FIG. 6 differs from the example illustrated in FIG. 2 of the first preferred embodiment in the conductive patterns provided on the base material layers S9 and S10. In the second preferred embodiment, the capacitor electrode C21 provided on the base material layer S9 is connected to the side-portion terminal electrode E22. The capacitor electrode C22 provided on the base material layer S10 is connected to the side-portion terminal electrode E21.

Referring to FIG. 6, the ground electrodes G1 and G2 and the capacitor electrodes C11 and C12 define the first capacitor C1. The capacitor electrodes C21 and C22 define the second capacitor C2. In addition, the capacitor electrode C22 and the ground electrode G1 define a third capacitor C3. The remaining configuration is the same or substantially the same as that described in the first preferred embodiment.

Figure 7A:
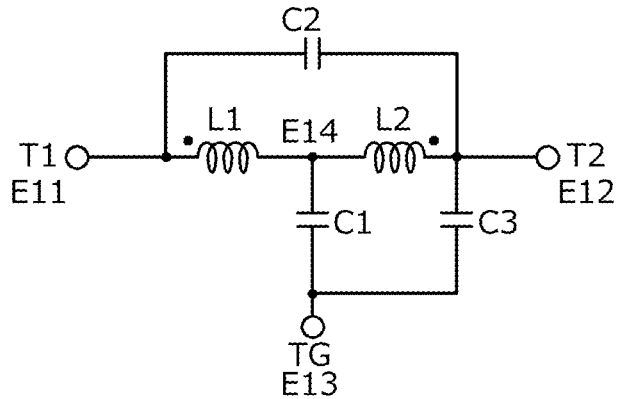
FIG. 7A is a circuit diagram of a filter element 102 according to the second preferred embodiment of the present invention and FIG. 7B is an equivalent circuit diagram of the filter element 102.
Figure 7B:
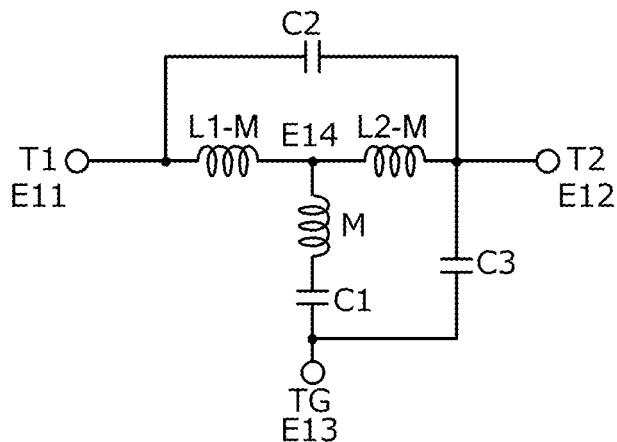

FIG. 7A is a circuit diagram of a filter element 102 according to the second preferred embodiment. FIG. 7B is an equivalent circuit diagram of the filter element 102. Referring to FIG. 7A, the first coil L1 and the second coil L2, which are connected in series to each other, and the first capacitor C1, which is shunt-connected to the first coil L1 and the second coil L2, define a T-shaped filter. In addition, the second capacitor C2 is connected in parallel to the series circuit of the first coil L1 and the second coil L2 to define the "parallel connection circuit". The filter element 102 further includes the third capacitor C3 connected between the second terminal T2 and the reference potential terminal TG.

As in the filter element 101 described in the first preferred embodiment, the LC series circuit including the mutual inductance M and the first capacitor C1 provides the first attenuation pole and the LC parallel circuit including the series circuit of the first coil L1 and the second coil L2 and the second capacitor C2 provides the second attenuation pole.

The third capacitor C3 attenuates a frequency band higher than the first attenuation pole and the second attenuation pole. The third capacitor C3 also defines and functions as a matching circuit to match the impedance of a circuit connected to the second terminal T2 and the impedance of the filter element 102.

Figure 8:
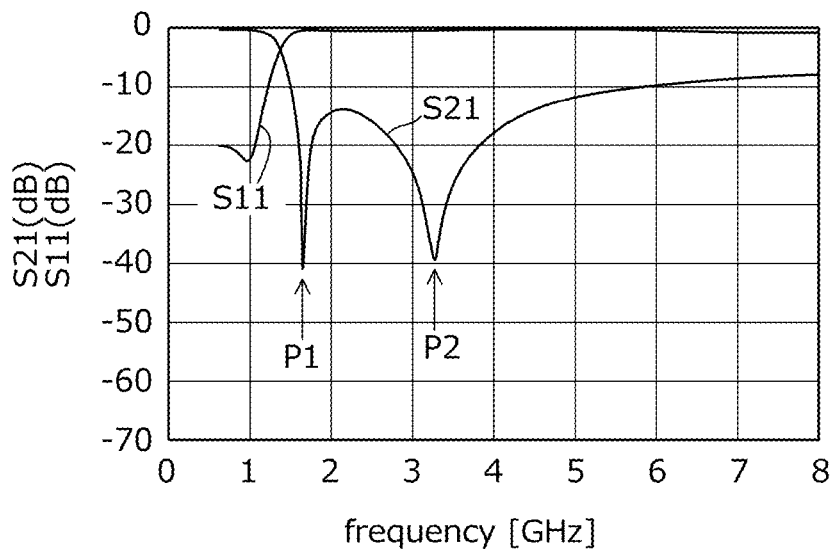
FIG. 8 is a graph of the frequency characteristics of the filter element 102.

FIG. 8 is a graph of the frequency characteristics of the filter element 102 of the present preferred embodiment. FIG. 8 is a graph of the frequency characteristics of the reflection coefficient S11 and the permeability coefficient S21. The respective elements illustrated in FIG. 7A have the following values:

L1: about 9.3 nH
L2: about 11.6 nH
C1: about 1.6 pF
C2: about 0.2 pF
C3: about 0.5 pF
k: about 0.6

Referring to FIG. 8, the attenuation pole P1 is the first attenuation pole provided by the LC series circuit including the mutual inductance M and the first capacitor C1, and the attenuation pole P2 is the second attenuation pole provided by the parallel connection circuit including the series circuit of the first coil L1 and the second coil L2 and the second capacitor C2.

Figure 9:
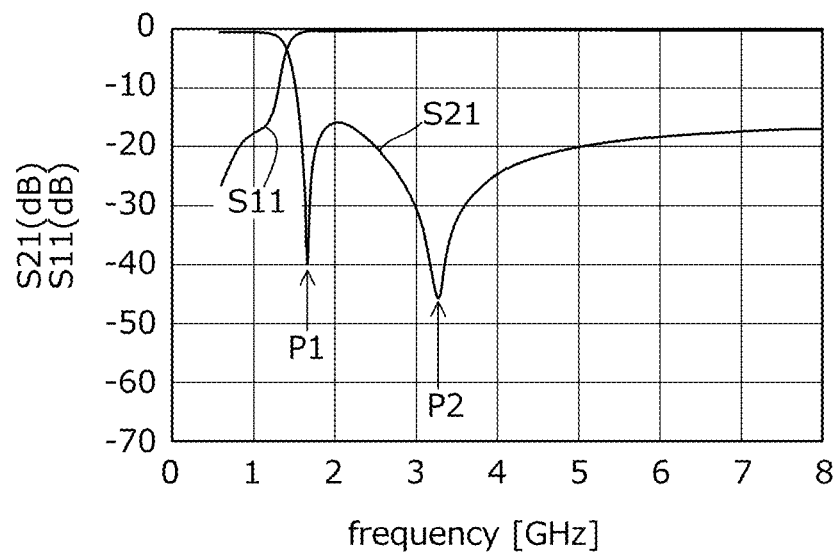
FIG. 9 is a graph of the frequency characteristics of the filter element 102 having a partially different configuration.

FIG. 9 is a graph of the frequency characteristics of the filter element 102 when the capacitance of the third capacitor C3 is changed from that in the above example. The characteristics illustrated in FIG. 9 are an example in which the capacitance of the third capacitor C3 is set to about 2 pF.

As apparent from a comparison of FIG. 8 and FIG. 5, the attenuation is increased in a frequency band not lower than about 3.5 GHz. This is the functional effect of the third capacitor C3. In other words, the frequency band not lower than about 3.5 GHz is attenuated due to the LC circuit including the first coil L1, the second coil L2, and the third capacitor C3.

In the example in FIG. 9, the attenuation at a frequency not lower than about 1.5 GHz is further increased by increasing the capacitance of the third capacitor C3 and decreasing the cutoff frequency of the LC circuit including the first coil L1, the second coil L2, and the third capacitor C3. However, if the capacitance of the third capacitor C3 is excessively increased, impedance matching with a circuit connected to the filter element 102 is not achieved which increases the insertion loss. The insertion loss at about 900 MHz is about 0.365 dB in the example illustrated in FIG. 8, while the insertion loss at about 900 MHz is about 0.516 dB in the example illustrated in FIG. 9.

Accordingly, the capacitance of the third capacitor C3 is preferably determined in consideration of the balance between the insertion loss and the attenuation.

Figure 10:
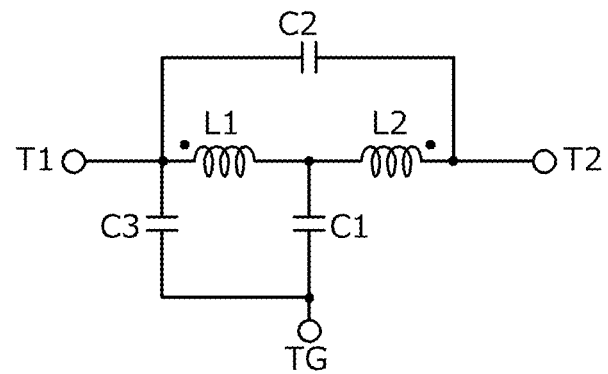
FIG. 10 is a circuit diagram of a filter element different from FIG. 7A in the connection position of a third capacitor C3.

FIG. 10 is a circuit diagram of a filter element different from FIG. 7A in the connection position of the third capacitor C3. In the example in FIG. 10, the third capacitor C3 is connected between the first terminal T1 and the reference potential terminal TG. This third capacitor C3 defines and functions as a matching circuit to match the impedance of a circuit connected to the first terminal T1 with the impedance of the filter element.

Third Preferred Embodiment

In a third preferred embodiment of the present invention, an example of a filter element is described, in which the first attenuation pole P1 is close to the second attenuation pole P2 to increase the attenuation near the first attenuation pole P1.

Figure 11A:
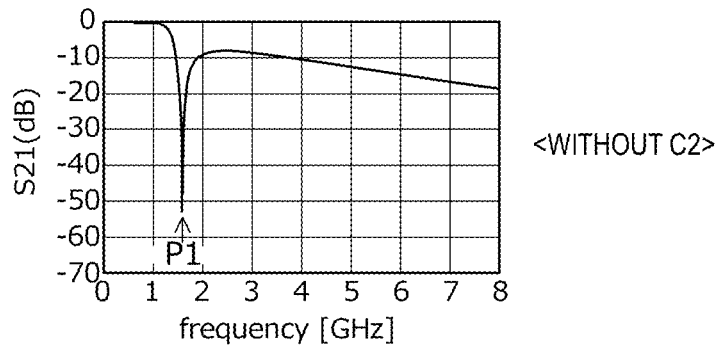
FIGS. 11A to 11D are graphs of the frequency characteristics of the respective filter elements according to a third preferred embodiment of the present invention.
Figure 11B:
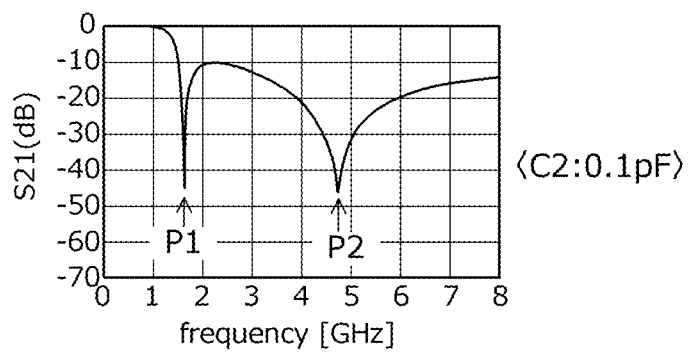
Figure 11C:
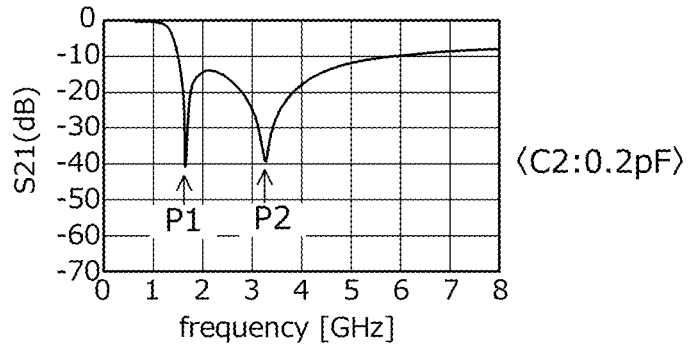
Figure 11D:
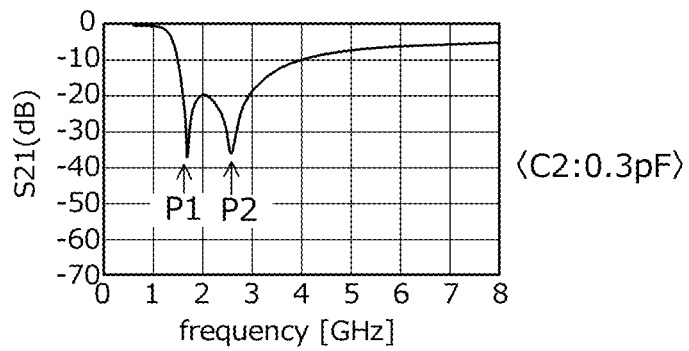

FIGS. 11A to 11D show the frequency characteristics of the permeability coefficient of the filter element when the value of the second capacitor C2 is varied in the filter element 102 illustrated in FIG. 7A in the second preferred embodiment. FIG. 11A shows a characteristic in a comparative example in a state in which the second capacitor C2 is not provided. FIG. 11B shows a characteristic when the second capacitor C2 have a value of about 0.1 pF. FIG. 11C shows a characteristic when the second capacitor C2 has a value of about 0.2 pF. FIG. 11D shows a characteristic when the second capacitor C2 have a value of about 0.3 pF. The example in FIG. 11C is the same or substantially the same as the example illustrated in FIG. 8.

As described above, the second attenuation pole P2 provided by the parallel connection circuit including the series circuit of the first coil L1 and the second coil L2 and the second capacitor C2 is determined by the capacitance of the second capacitor C2. The attenuation in a band at the high frequency side of the first attenuation pole P1 is capable of being increased by making the second attenuation pole P2 close to the first attenuation pole P1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter element comprising:
    a multilayer body including laminated base material layers, internal elements in the multilayer body, a first terminal electrode, a second terminal electrode, and a reference potential electrode on an outer surface of the multilayer body; wherein
    the internal elements include a first coil, a second coil, a first capacitor, and a second capacitor;
    the first coil and the second coil have winding axes in a laminated direction of the base material layers and a coil opening of the first coil is overlapped with a coil opening of the second coil for magnetic coupling;
    the first capacitor and the second capacitor are on base material layers of the multilayer body different from base material layers on which the first coil and the second coil are provided;
    the first coil is differentially connected to the second coil;
    the second capacitor is connected in parallel to a series circuit of the first coil and the second coil;
    the first capacitor is connected between a position where the first coil is connected to the second coil and the reference potential electrode;
    the second coil is spaced farther from the first capacitor and the second capacitor, compared with the first coil; and
    an inductance of the second coil is higher than an inductance of the first coil.

2. A filter element comprising:
    a multilayer body including laminated base material layers, internal elements in the multilayer body, a first terminal electrode, a second terminal electrode, and a reference potential electrode on an outer surface of the multilayer body; wherein
    the internal elements include a first coil, a second coil, a first capacitor, and a second capacitor;
    the first coil and the second coil have winding axes in a laminated direction of the base material layers and a coil opening of the first coil is overlapped with a coil opening of the second coil for magnetic coupling;
    the first capacitor and the second capacitor are on base material layers of the multilayer body different from base material layers on which the first coil and the second coil are provided;
    the first coil is differentially connected to the second coil;
    the second capacitor is connected in parallel to a series circuit of the first coil and the second coil;
    the first capacitor is connected between a position where the first coil is connected to the second coil and the reference potential electrode;
    mutual inductance caused by coupling between the first coil and the second coil and the first capacitor provides a first attenuation pole; and
    a parallel connection circuit of the series circuit and the second capacitor provides a second attenuation pole.

3. The filter element according to claim 2, wherein the second attenuation pole is at a high frequency side of the first attenuation pole.

4. The filter element according to claim 2, wherein
    the second coil is spaced farther from the first capacitor and the second capacitor, compared with the first coil; and
    an inductance of the second coil is higher than an inductance of the first coil.

5. The filter element according to claim 2, wherein
    a capacitance of the first capacitor is higher than a capacitance of the second capacitor; and
    the first capacitor is spaced farther from the first coil and the second coil, compared with the second capacitor.

6. The filter element according to claim 2, further comprising a third capacitor connected between the first terminal electrode and the reference potential electrode or between the second terminal electrode and the reference potential electrode, and providing impedance matching with a circuit connected to the first terminal electrode or the second terminal electrode.

7. The filter element according to claim 2, further comprising:
    a third capacitor connected between the first terminal electrode and the reference potential electrode or between the second terminal electrode and the reference potential electrode, and providing impedance matching with a circuit connected to the first terminal electrode or the second terminal electrode; wherein
    the third capacitor is connected between the second terminal electrode and the reference potential electrode and attenuates a frequency band higher than the first attenuation pole and the second attenuation pole.

8. A filter element comprising:
    a multilayer body including laminated base material layers, internal elements in the multilayer body, a first terminal electrode, a second terminal electrode, and a reference potential electrode on an outer surface of the multilayer body; wherein
    the internal elements include a first coil, a second coil, a first capacitor, and a second capacitor;
    the first coil and the second coil have winding axes in a laminated direction of the base material layers and a coil opening of the first coil is overlapped with a coil opening of the second coil for magnetic coupling;
    the first capacitor and the second capacitor are on base material layers of the multilayer body different from base material layers on which the first coil and the second coil are provided;
    the first coil is differentially connected to the second coil;
    the second capacitor is connected in parallel to a series circuit of the first coil and the second coil;
    the first capacitor is connected between a position where the first coil is connected to the second coil and the reference potential electrode; and
    at least a portion of each of the first capacitor and the second capacitor is on a same one of the base material layers.

9. The filter element according to claim 8, wherein
    the first capacitor is on at least two of the base material layers; and
    the at least two of the base material layers include the same one of the base material layers.

10. The filter element according to claim 9, wherein the first capacitor is the only capacitor on at least one of the at least two of the base material layers.

* * * * *